(12) United States Patent
Moyer et al.

(10) Patent No.: US 8,566,672 B2
(45) Date of Patent: Oct. 22, 2013

(54) SELECTIVE CHECKBIT MODIFICATION FOR ERROR CORRECTION

(75) Inventors: William C. Moyer, Dripping Springs, TX (US); Joseph C. Circello, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 383 days.

(21) Appl. No.: 13/053,962

(22) Filed: Mar. 22, 2011

(65) Prior Publication Data

US 2012/0246542 A1    Sep. 27, 2012

(51) Int. Cl.
*G11C 29/00* (2006.01)

(52) U.S. Cl.
USPC .......................... 714/768; 714/773

(58) Field of Classification Search
USPC ................................. 714/768, 773
See application file for complete search history.

(56) References Cited

U.S. PATENT DOCUMENTS

| | | | |
|---|---|---|---|
| 3,814,922 A | 6/1974 | Nibby et al. |
| 4,768,197 A | 8/1988 | Petolino et al. |
| 4,897,839 A | 1/1990 | Yamagishi et al. |
| 5,099,484 A | 3/1992 | Smelser |
| 5,146,461 A | 9/1992 | Duschatko et al. |
| 5,375,127 A | 12/1994 | Leak |
| 5,430,742 A | 7/1995 | Jeddeloh et al. |
| 5,848,293 A | 12/1998 | Gentry |
| 5,954,831 A | 9/1999 | Chang |
| RE36,448 E | 12/1999 | Brady |
| 6,253,273 B1 | 6/2001 | Blumenau |
| 6,480,975 B1 | 11/2002 | Arimilli et al. |
| 6,772,383 B1 | 8/2004 | Quach et al. |
| 6,880,112 B2 | 4/2005 | Lajolo |
| 6,954,826 B2 | 10/2005 | Moyer |
| 7,069,494 B2 | 6/2006 | Cargnoni et al. |
| 7,257,762 B2 | 8/2007 | Holm et al. |
| 7,272,773 B2 | 9/2007 | Cargnoni et al. |
| 7,334,179 B2 | 2/2008 | Zhang et al. |
| 7,376,877 B2 | 5/2008 | Quach et al. |
| 7,398,449 B1 | 7/2008 | Normoyle et al. |
| 7,409,502 B2 | 8/2008 | Moyer et al. |
| 7,480,847 B2 | 1/2009 | Schulz |
| 7,506,226 B2 | 3/2009 | Gajapathy et al. |
| 7,526,713 B2 | 4/2009 | Klein |
| 7,568,146 B2 | 7/2009 | Takahashi et al. |
| 7,617,437 B2 | 11/2009 | Moyer |
| 7,900,100 B2 | 3/2011 | Gollub |

(Continued)

OTHER PUBLICATIONS

Final Office Action mailed May 15, 2012 in U.S. Appl. No. 13/097,721;10 pages.

(Continued)

*Primary Examiner* — M. Mujtaba K Chaudry

(57) ABSTRACT

Error correction code (ECC) checkbits are generated for each write access to a memory address based on both the data to be written (the write data) and the memory address. The ECC checkbits are stored with the data and, in response to a read access at the memory address, are employed to check for errors in both the address and the data provided in response to the read access (the read data). The ECC checkbit generation process can result, for particular memory addresses, in checkbits that can incorrectly indicate whether errors are present in the read data. Accordingly, the checkbits can be selectively inverted based on the memory address so that the checkbit pattern will not result in an incorrect error detection or correction.

20 Claims, 5 Drawing Sheets

(56) References Cited

U.S. PATENT DOCUMENTS

| | | |
|---|---|---|
| 2003/0188251 A1 | 10/2003 | Brown et al. |
| 2005/0240745 A1 | 10/2005 | Iyer et al. |
| 2005/0257025 A1 | 11/2005 | Spencer |
| 2006/0010339 A1 | 1/2006 | Klein |
| 2006/0031739 A1 | 2/2006 | Gan et al. |
| 2006/0117239 A1 | 6/2006 | Lin et al. |
| 2006/0236205 A1* | 10/2006 | Kuramoto et al. ............ 714/763 |
| 2007/0136647 A1 | 6/2007 | Kanai et al. |
| 2007/0150671 A1 | 6/2007 | Kurland |
| 2007/0266297 A1 | 11/2007 | Liang et al. |
| 2007/0277085 A1* | 11/2007 | Goessel et al. ................ 714/824 |
| 2008/0016428 A1 | 1/2008 | Lee et al. |
| 2008/0055125 A1* | 3/2008 | Cideciyan et al. ............. 341/94 |
| 2008/0109705 A1 | 5/2008 | Pawlowski et al. |
| 2008/0162829 A1 | 7/2008 | Scott et al. |
| 2008/0235558 A1 | 9/2008 | Normoyle et al. |
| 2008/0294840 A1* | 11/2008 | Bliss et al. ................... 711/105 |
| 2009/0049350 A1 | 2/2009 | Parris et al. |
| 2009/0100315 A1 | 4/2009 | Lee |
| 2009/0249148 A1 | 10/2009 | Ito et al. |
| 2009/0307537 A1 | 12/2009 | Chen et al. |
| 2010/0106872 A1 | 4/2010 | Moyer et al. |
| 2010/0107243 A1 | 4/2010 | Moyer et al. |
| 2011/0040924 A1 | 2/2011 | Selinger |
| 2011/0138252 A1 | 6/2011 | Pawlowski et al. |
| 2012/0066567 A1 | 3/2012 | Moyer et al |
| 2012/0166904 A1* | 6/2012 | Bandholz ...................... 714/746 |

OTHER PUBLICATIONS

Non-Final Office Action mailed Jan. 18, 2013 for U.S. Appl. No. 13/097,721, 29 pages.

Non-Final Office Action mailed Apr. 5, 2013 for U.S. Appl. No. 13/159,878, 36 pages.

U.S. Appl. No. 13/097,721, filed Apr. 29, 2011, entitled "Selective Error Detection and Error Correction for a Memory Interface,".

U.S. Appl. No. 12/886,641, filed Sep. 21, 2010, entitled "Data Processor for Processing Decorated Instructions with Cache Bypass,".

U.S. Appl. No. 13/159,878, filed Jun. 14, 2011, entitled "Selective Masking for Error Correction,".

* cited by examiner

FIG. 5

SELECTIVE CHECKBIT MODIFICATION FOR ERROR CORRECTION

FIELD OF THE DISCLOSURE

The present disclosure relates generally to data processing devices, and more particularly to error detection and correction for data processing devices.

BACKGROUND

Data processing operations frequently involve transfers of data between endpoints, whereby a data source provides the data for transfer and a data sink subsequently receives the data. A memory device is typically employed to temporarily store the transferring data between the data source and data sink. However, the transfer and storage of the data at the memory device can introduce errors in the data. For example, a faulty memory module can cause bits of the data to be represented at the memory device in an incorrect state. Accordingly, some data processing systems employ error correction techniques whereby error correction code (ECC) checkbits are calculated for each segment of data stored at the memory device. In response to a request to transfer data from the memory to a data sink, the ECC checkbits stored in the memory are used to detect and correct errors in the stored data. However, in certain data processing systems, the memory device does not detect errors in the data that result from the transfer of data to the processor unit. Accordingly some data processing devices employ end-to-end (e2e) error detection and correction, whereby ECC checkbits are generated at the data source and error detection is performed at the data sink. This allows for detection and correction of errors resulting both from temporary storage of data as well as errors resulting from data transfer.

BRIEF DESCRIPTION OF THE DRAWINGS

The present disclosure may be better understood, and its numerous features and advantages made apparent to those skilled in the art by referencing the accompanying drawings.

FIG. 5 is a diagram of a checkbit generation matrix that can be employed to create the exclusive-OR modules of FIG. 2 in accordance with one embodiment of the present disclosure.

DETAILED DESCRIPTION

FIGS. 1-5 illustrate example techniques for performing error detection and correction at a data processing device. Error correction code (ECC) checkbits are generated for each write access to a memory address based on both the data to be written (the write data) and the memory address. The ECC checkbits are stored with the data and, in response to a read access at the memory address, are employed to check for errors in both the address and the data provided in response to the read access (the read data). The ECC checkbit generation process can result, for particular memory addresses and data values, in checkbit values that may correspond to undesired stored values in the memory. For such undesired stored values, it can be difficult for a conventional ECC error detection and correction process to differentiate between correctly transferred data and a catastrophic error in the data transfer. One example of an undesired stored value is the value of all zeros in both the stored data and checkbits, the combination of which is known as a stored codeword. A codeword value of all zeros may be incorrectly indicated by conventional error detection to be a valid error-free codeword when the codeword value in fact indicates a failure mode of the memory device. For example, a failure to properly access the memory device can result in an all-zeros codeword being delivered in response to the failed access. A similar failure mode may result in a codeword value of all 1's being delivered by the memory device when accessed. To avoid undesired codewords that can result in error misdetection, generated ECC checkbits can be selectively inverted for those memory addresses that can cause generation of an undesired codeword.

Figure 1:
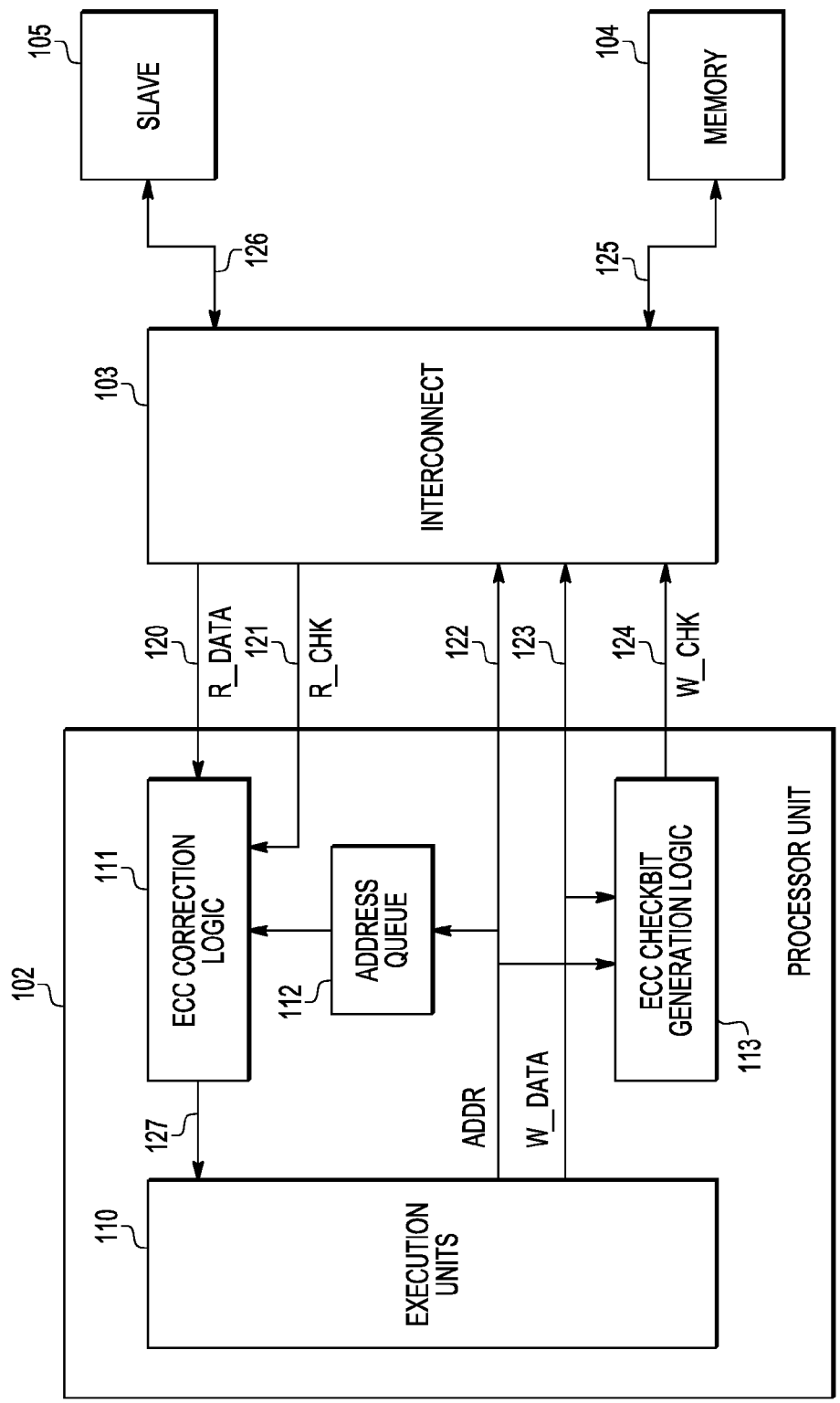
FIG. 1 is a block diagram illustrating a data processing device in accordance with a specific embodiment of the present disclosure.

FIG. 1 illustrates a data processing device 100 in accordance with one embodiment of the present disclosure. In the embodiment illustrated at FIG. 1, the data processing device 100 is a general purpose data processing device that can be incorporated into an electronic device, such as a portable electronic device, computer devices, automotive device, and the like. The data processing device 100 is generally configured to decode a set of instructions into one or more operations, and execute the operations in order to perform tasks associated with the electronic system. For example, the data processing device 100 can be incorporated in a mobile telephone device, and execute sets of instructions to send and receive phone calls, access the Internet, send and receive text messages, and the like.

As described further herein, the data processing device 100 employs an end-to-end error detection and correction scheme. To illustrate, a data source at the data processing device 100 generates data to be stored at a memory address. Based on both the data and the address, the data source generates a set of ECC checkbits, and provides both the data and the ECC checkbits to a memory device for storage at the memory address. The combined data and checkbits are stored as a codeword. A typical codeword might consist of 64 data bits and 8 checkbits, where the checkbits are calculated according to a particular coding scheme using the 64 data bits as well as the memory address value (or a portion thereof) of the location the data is stored. A data sink can access the stored data by providing the memory address to the memory device, which in response provides both the stored data and the associated ECC checkbits. The data sink performs error detection and correction using the ECC checkbits based on the predetermined coding scheme. The data sink can therefore detect errors both in the stored data and in the memory address provided to the memory device.

For some combinations of data and memory addresses, the ECC checkbit generation process can result in checkbits that will result in misdetection of certain types of errors. For example, for some types of errors, such as a defective address decoder or wordline driver, a memory read operation will return a codeword (data and ECC checkbits) value of all negated values (logical 0's) or all asserted values (logical 1's). However, in some ECC coding schemes, storage of a data value that is a set of all logical negated values or all logical asserted values will result in a set of ECC checkbits that are all logical negated values or all logical asserted values, respectively. Accordingly, for these combinations of data and checkbit values, the ECC error detection process cannot differentiate between an error-free data transfer and the occurrence of a catastrophic error. In non-end-to-end ECC systems, the error misdetection can be addressed by inverting, for every set of generated checkbit values, at the memory device, one or more of the checkbit values. However, because the data processing device 100 employs end-to-end error detection and correction, and therefore incorporates at least a portion of a memory address in ECC checkbit calculation, simple inversion of checkbit values can result in an error misdetection by generating an undesired codeword value of all zeros or all ones. For example, in a linear coding scheme, an address value of all zeros and a data value of all zeros will result in a codeword of all zeros, as the generated checkbit values will be all zeros. A simple inversion of one or more of the checkbit values, such as an inversion of one of the checkbits will generate a non-zero codeword for an address value of all zeros and data value of all zeros in a linear coding scheme. However, for other address values which when combined with a data value of all zeros generate a set of checkbits in which all checkbits are zero except the checkbit(s) to be inverted, then the inversion causes an undesired codeword value of all zeros to be produced. Thus, inclusion of address information into the checkbit coding scheme protects against addressing errors, but also causes simple inversion schemes to fail to avoid undesired codewords for certain address and data combinations. Accordingly, the data processing device 100 employs an ECC process whereby generated ECC checkbits are selectively inverted based on a memory address, or portion thereof, associated with the ECC checkbits.

To illustrate, a data source at the data processing device 100 can determine that a memory address associated with a data transfer can result in generation of a set of ECC checkbits that will generate a codeword to be avoided because the codeword has the potential to cause an error misdetection. For purposes of discussion, such a memory address is referred to herein as a misdetection memory address. Accordingly, in response to determining a write access is associated with a misdetection memory address, the data source can invert one or more of the generated checkbits, reducing the likelihood of error misdetection. For memory addresses that are not misdetection memory addresses, the checkbits are not inverted. In other embodiments, detection of the potential error misdetection can take place at the data sink, or at the memory device where data is to be stored. Further, in some embodiments, the ECC checkbit component for the memory address can be generated and selectively inverted separately and in parallel with generation of the ECC checkbit component for the data to be stored, thereby improving performance.

Referring again to FIG. 1, the data processing device 100 includes a processor unit 102, an interconnect 103, a memory device 104, and a slave device 105. The processor unit 102 is connected to the interconnect 103 via a set of busses, labeled bus 120 through bus 124, while the memory 104 is connected to the interconnect 103 via a bus 125. The slave device 105 is connected to the interconnect 103 via a bus 126.

The processor unit 102 is a module configured to decode processor instructions into one or more operations and execute the operations in order to perform the functions of the data processing device 100. For example, in one embodiment the data processing device 100 is part of an automobile control system, and the processor unit 102 executes operations to control aspects of the automobile's functions, such as detection of automobile conditions, management and control of different automotive features, and the like.

An example operation that can be executed by the processor unit 102 is referred to as a memory access, whereby the processor unit 102 provides data to be transferred to a memory device (a write operation) or requests data to be transferred from the memory device to the unit (a read operation). In addition, the processor unit performs error detection and correction functions for the data transfer operations.

To illustrate, for a write operation, the processor unit 102 provides, via bus 123, the data to be transferred (the write data, W_DATA) and provides, via bus 122, an address (ADDR) of the memory location to which the write data is to be transferred. In addition, the processor unit 102 can generate a set of ECC checkbits based on both the address and the write data and provide the set of ECC checkbits via the bus 124 (W_CHK). As described further herein, the ECC checkbits can be used by a data sink to detect and correct errors in both the write data and the address.

For a read operation, the processor unit 102 provides, via bus 122 the address of the location of the data to be transferred (the read data, R_DATA). In response, the processor unit 102 receives, via bus 120, the read data and receives, via bus 121, the set of ECC checkbits (R_CHK) associated with the read data and the address. The processor unit 102 can perform error correction and detection on the read data and address using the received ECC checkbits.

The interconnect 103 is a communication link configured to transfer information between the processor unit memory 102, the memory device 104, the slave device 105, and other devices (not shown). Accordingly, the interconnect 103 can manage communication overhead features, such as communication routing, buffering, flow control, bus management, communication acknowledgement, and the like. The interconnect 103 can also manage other device functions, such as interrupt signaling, memory coherency, and the like.

The memory device 104 includes memory locations configured to store information, and retrieve stored information, based on address information, data information, and control signaling, all received via the bus 125. In particular, in response to a write operation, as indicated by an address, write data, ECC checkbits, and associated control signaling received via bus 125, the memory 104 can store the write data and ECC checkbits at a memory location corresponding to the address. In response to a read operation, as indicated by an address and associated control signaling received via bus 125, the memory 104 retrieves the read data and ECC checkbits stored at the indicated memory location and provides the retrieved information via the bus 125.

The slave 105 is a device, such as an input/output device, configured to receive and provide information via the bus 126. The received information can be employed to send the slave 105 commands, configure operation of the slave 105, and the like. The provided information can include command responses, device status information, and the like.

The processor unit 102 includes execution units 110, ECC correction logic 111, address queue 112, ECC and checkbit generation logic 113. The execution units 110 are connected to busses 120 and 121 and to ECC correction logic 111 via a bus 127. The address queue 112 is connected to the bus 122 and to the ECC correction logic 111. The ECC correction logic 111 is also connected to the busses 120 and 121. The ECC checkbit generation logic 113 is connected to the busses 122-124.

The execution units 110 are a part of an instruction pipeline (not shown) of the processing unit 102, and execute operations, including data transfer operations, dispatched by the pipeline. Accordingly, for write operations, the execution units 110 determine both the memory address and the data associated with the operation, provides the memory address via bus 122 and the write data via the bus 123. For read operations the execution units 110 determine the memory address to be read, provide the determined memory address via the bus 122, and receive the data associated with the memory address via the bus 127. The execution units 110 can perform further operations on the received data, provide the data to other modules of the processor unit 102, and the like.

The address queue 112 is a first-in first out (FIFO) storage module that retrieves, from the bus 122, and stores memory addresses associated with read operations. In an embodiment, the address queue determines that a memory address provided via the bus 122 is associated with a read access based on control signaling (not shown) provided by the execution units 110. Address queue 112 maintains a set of one or more memory access addresses associated with outstanding (i.e. in-progress) read transactions issued by processor unit 102 to the interconnect 103 for processing by memory unit 104, slave unit 105, or other units within data processing system 100 (not shown).

The ECC checkbit generation logic 113 generates ECC checkbits for write accesses. In particular, during a write access, the ECC checkbit generation logic is provided to the memory address where the write data is to be written (the write address) via the bus 122 and is provided the write data via the bus 123. Based on both the write address and the write data, the ECC checkbit generation logic 113 generates checkbits according to a conventional ECC checkbit generation technique, such as using a Hamming-based error correction matrix, or using a similar Hsaio coding scheme. Other error correction coding schemes such as Reed-Solomon or Bose-Chaudhuri-BCH codings may also be employed. In addition, the ECC checkbit generation logic 113 determines whether the write address is a misdetection memory address. The determination can be made in a number of ways. In one embodiment, the ECC checkbit generation logic 113 can determine the write address is a misdetection memory address by comparing the write address to a stored set of memory misdetection addresses. In another embodiment, during ECC checkbit generation, the ECC checkbit generation logic 113 can determine a misdetection memory address by comparing the checkbits, or a portion thereof, to a stored set of ECC checkbit patterns that are predicted to result in codewords to be avoided during the ECC detection process.

In response to determining the write address is a misdetection memory address, the ECC checkbit generation logic 113 selectively inverts one or more of the ECC checkbits. In an embodiment, the same bit positions in the ECC checkbits are inverted for all misdetection memory addresses. In another embodiment, the ECC checkbit generation logic 113 can invert different bit positions for different misdetection memory addresses. In response to determining that the write address is not a misdetection memory address, the ECC checkbit generation logic 113 does not invert any of the ECC checkbits. The generated ECC checkbits are provided by the ECC checkbit generation logic to the bus 124 for storage at the memory 104 together with the write data.

The ECC correction logic 111 performs error detection and correction for read operations. In particular, the ECC correction logic 111 receives read data via the bus 120 and a corresponding set of ECC checkbits via the bus 121. In response, the ECC correction logic 111 accesses the read address for the read operation stored at the address queue 112, and determines whether the read address is a misdetection memory address. If so, the ECC correction logic 111 inverts one or more of the received checkbits and performs error detection and correction based on the resulting set of checkbits. If the read address is not a misdetection memory address, the ECC correction logic 111 performs error detection and correction on the read data using the received set of checkbits without inversion.

The ECC error detection and correction performed by the ECC correction logic 111 can be in accordance with one or more conventional ECC detection and correction techniques, such as Hamming code error detection, Reed-Solomon error detection and the like. After the ECC error detection and correction, the ECC correction logic 111 provides the resulting data to the execution units 110 via the bus 127. The ECC correction logic 111 can also provide additional control information via the bus 127, such as an indication whether or not an error was detected in the read data, whether or not a detected error was corrected, and the like.

In the illustrated embodiment of FIG. 1, detection of misdetection addresses, and inversion of the ECC checkbits, takes place at the processor unit 102. In other embodiments, detection and inversion can take place at a memory device. This can be better understood with reference to FIG. 2, which illustrates a memory device 204 in accordance with one embodiment of the present disclosure.

Memory device 204 includes a control module 230 and a storage array 236, each connected to busses 222, 223, and 241. The control module 230 includes an address exclusive-OR (XOR) module 231, a pattern detection module 232, XOR modules 233 and 234, and a data XOR module 235. The address XOR module 231 includes an input connected to the ADDR bus 222 and an output. The data XOR module 235 includes an input connected to the W_DATA bus 223 and an output. The pattern detection module 232 includes an input connected to the output of the address XOR module 231 and an output. The XOR module 233 includes an input connected to the output of the address XOR module 231, an input connected to the output of the pattern detection module 232, and an output. The XOR module 234 includes an input connected to the output of the XOR module 233, an input connected to the output of the data XOR module 235, and an output connected to the bus 241.

In operation the address XOR module 231 receives a write address via the bus 222 and the data XOR module 235 receives corresponding write data via the bus 223. The address XOR module 231 performs a series of XOR operations based on the received write address to generate a set of ECC checkbits, referred to herein as address checkbits, according to a conventional checkbit generation technique, such as a Hamming code technique. The data XOR module 235 performs a series of XOR operations based on the received write data to generate another set of ECC checkbits, referred to herein as data checkbits. In an embodiment, the data checkbits are generated according to the same ECC generation technique as the technique used to generate the address checkbits. In another embodiment, different ECC generation techniques can be used to generate the data checkbits and the address checkbits.

The address XOR module 231 provides the generated address checkbits to the pattern detection module 232 and the XOR module 233. In response, the pattern detection module 232 determines whether the address checkbits matches any of a set of bit patterns that, when combined with the data checkbits according to an XOR operation, could result in a set of checkbits that are to be avoided so the checkbits would not cause the ECC correction logic 111 to misdetect an error in read data. The pattern detection module 232 thus effectively determines whether the write address received at the address XOR module 231 is a misdetection memory address. In the illustrated embodiment, the pattern detection module 232 makes this determination based on the pattern of the address checkbits. In another embodiment, the pattern detection module 232 can make the determination based on the write address itself, such as by comparing the write address to a set of predetermined misdetection memory addresses.

In response to determining the address checkbits do not indicate a misdetection memory address, the pattern detection module 232 provides a set of bits or other control signals at its output that, when combined with the address checkbits at XOR module 233, will result in the address checkbits being provided at the output of the module. In other words, the pattern detection module 232 provides a set of bits such that the address checkbits will not be altered by XOR module 233.

In response to determining that the address checkbits indicate the write address is a misdetection memory address, the pattern detection module 232 provides a set of bits at its output that, when combined with the address checkbits at XOR module 233, will result in the one or more selected bits of the address checkbits being inverted by the XOR module 233. In an embodiment, the pattern detection module 232 provides the same set of bits for all misdetection memory addresses, while in another embodiment the pattern detection module 232 can provide different sets of bits for different misdetection memory addresses.

The XOR module 233 combines, according to an XOR operation, the set of bits provided by the pattern detection module 232 with the address checkbits provided by the address XOR module 231. The XOR module 233 thus inverts one or more selected bits of the address checkbits or leaves the address checkbits unchanged, according to the set of bits provided by the pattern detection module 232. The XOR module 234 combines the set of checkbits provided by the XOR module 233 with the data checkbits provided by data XOR module 235, and provides the resulting set of checkbits via the bus 241.

The storage array 236 is a memory array including a set of memory locations each associated with a corresponding memory address. In response to receiving a write address via the bus 222 together with control signaling (not shown) indicating a write operation, the storage array 236 stores write data provided by the bus 223 and checkbits provided by the bus 241 at a memory location corresponding to the address. A read operation can be indicated to the storage array 236 by providing a read address via bus 222 along with associated control signaling. In response, the storage array 236 retrieves the read data and associated checkbits stored at the memory location indicated by the read address, and provides the read data and associated checkbits to the bus 223.

Figure 3:
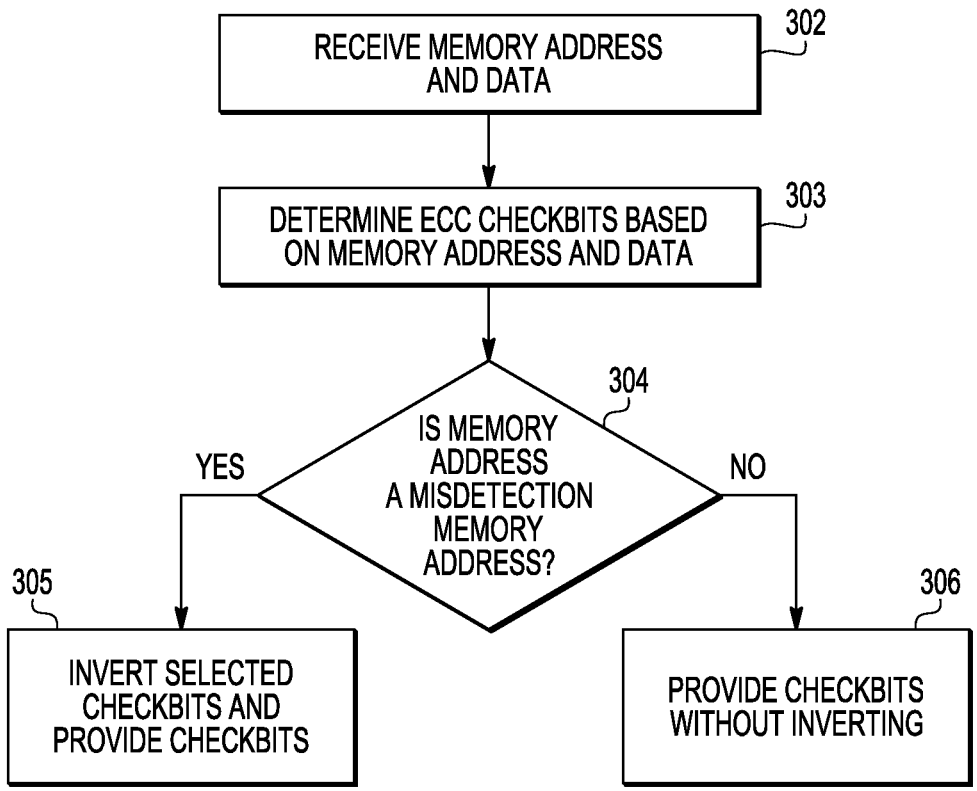
FIG. 3 is a flow diagram of a method of determining ECC checkbits at the data processing device of FIG. 1 in accordance with one embodiment of the present disclosure.

FIG. 3 illustrates a flow diagram of a method of determining ECC checkbits at the data processing device 100 in accordance with one embodiment of the present disclosure. At block 302, the processor unit 102 generates a memory access request such as a write operation or a read operation. The memory access request includes a memory address and data. In response to receiving the memory access request, at block 303 the processor unit 102 determines a set of ECC checkbits based on the data and memory address. In the case of a write operation, the processor unit 102 determines the set of ECC checkbits by generating the ECC checkbits based on the data and memory address. In the case of a read operation, the processor unit 102 determines the set of ECC checkbits by receiving the ECC checkbits from the memory 104.

At block 304 the processor unit 102 determines if the memory address is a misdetection memory address. In one embodiment, this determination is made directly from the memory address, such as by comparing the memory address to one or more predetermined memory addresses. In another embodiment, the determination is made based on the set of ECC checkbits (corresponding to the address portion of the XOR logic), such as by comparing the checkbit pattern with one or more predetermined checkbit patterns. If the memory address is determined to be a misdetection memory addresses, the method flow proceeds to block 305 and the processor unit 102 inverts one or more selected bits of the ECC checkbits. The processor unit 102 then uses the ECC checkbits to provide checked and corrected data to the execution units 110 (in the case of a read operation) or provides the checkbits to the memory device 104 for storage (in the case of a write operation).

Figure 4:
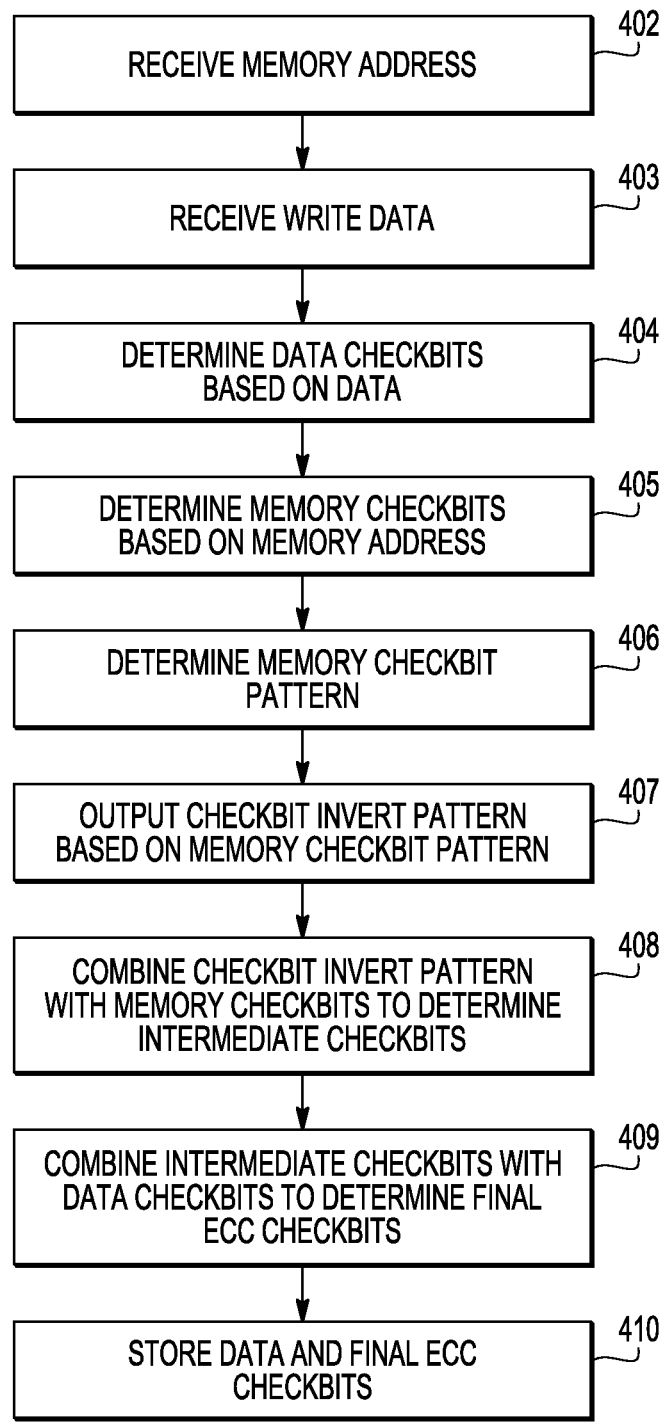
FIG. 4 is a flow diagram of a method of determining ECC checkbits at the memory device of FIG. 2 in accordance with one embodiment of the present disclosure.

FIG. 4 illustrates a flow diagram of a method of generating ECC checkbits at the memory device 204 according to one embodiment of the present disclosure. At block 402 the address XOR module 231 receives a write address associated with a write operation. At block 403 the data XOR module 235 receives write data associated with the write operation. At block 404 the data XOR module 235 determines data checkbits based on the data. At block 405 the address XOR module 231 determines address checkbits based on the write address. At block 406 the pattern detection module 232 determines the pattern of the memory checkbits by comparing the checkbits to one or more stored address checkbit patterns. At block 407, the pattern detection module 232 outputs a checkbit invert pattern of bits based on the address checkbit pattern. In particular, if the address checkbit pattern indicates that the memory address is a misdetection address, the pattern detection module 232 outputs a checkbit invert pattern to invert one or more selected bits of the address checkbits. If the address checkbit pattern indicates that the memory address is a not a misdetection address, the pattern detection module 232 outputs a checkbit invert pattern so that the address checkbits will not be inverted.

At block 408 the XOR module 233 combines the address checkbits and the checkbit invert pattern according to an exclusive-or operation. The XOR module 233 outputs the combination as a set of intermediate checkbits. At block 409, the XOR module 234 combines the set of intermediate checkbits with the data checkbits according to an exclusive-or operation, and outputs the result as a set of final ECC checkbits. At block 410 the write data on bus 223 and the final ECC checkbits on bus 241 are stored at the memory array 236.

Figure 2:
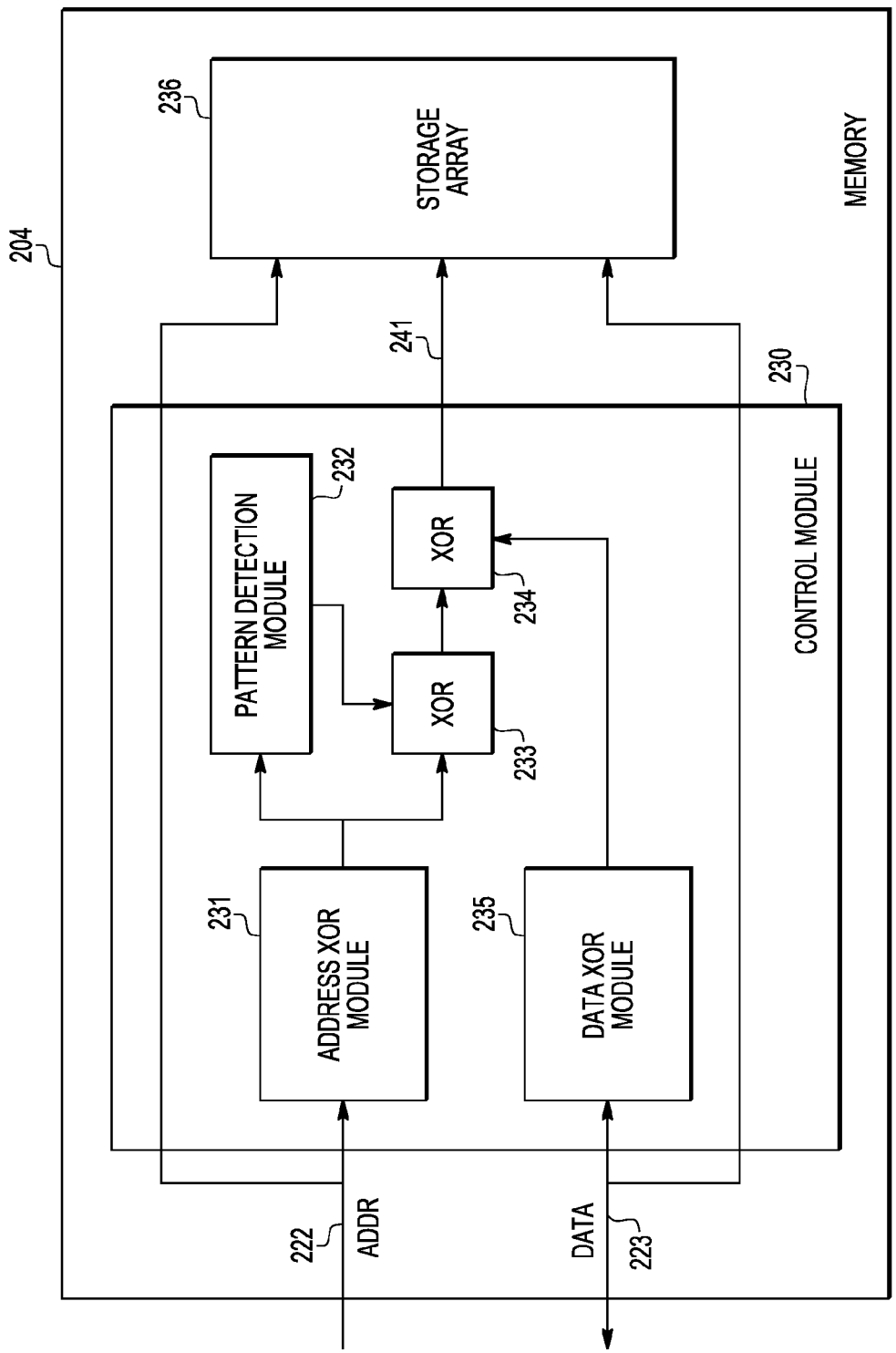
FIG. 2 is a block diagram of the memory device of FIG. 1 in accordance with one embodiment of the present disclosure.
Figure 5:
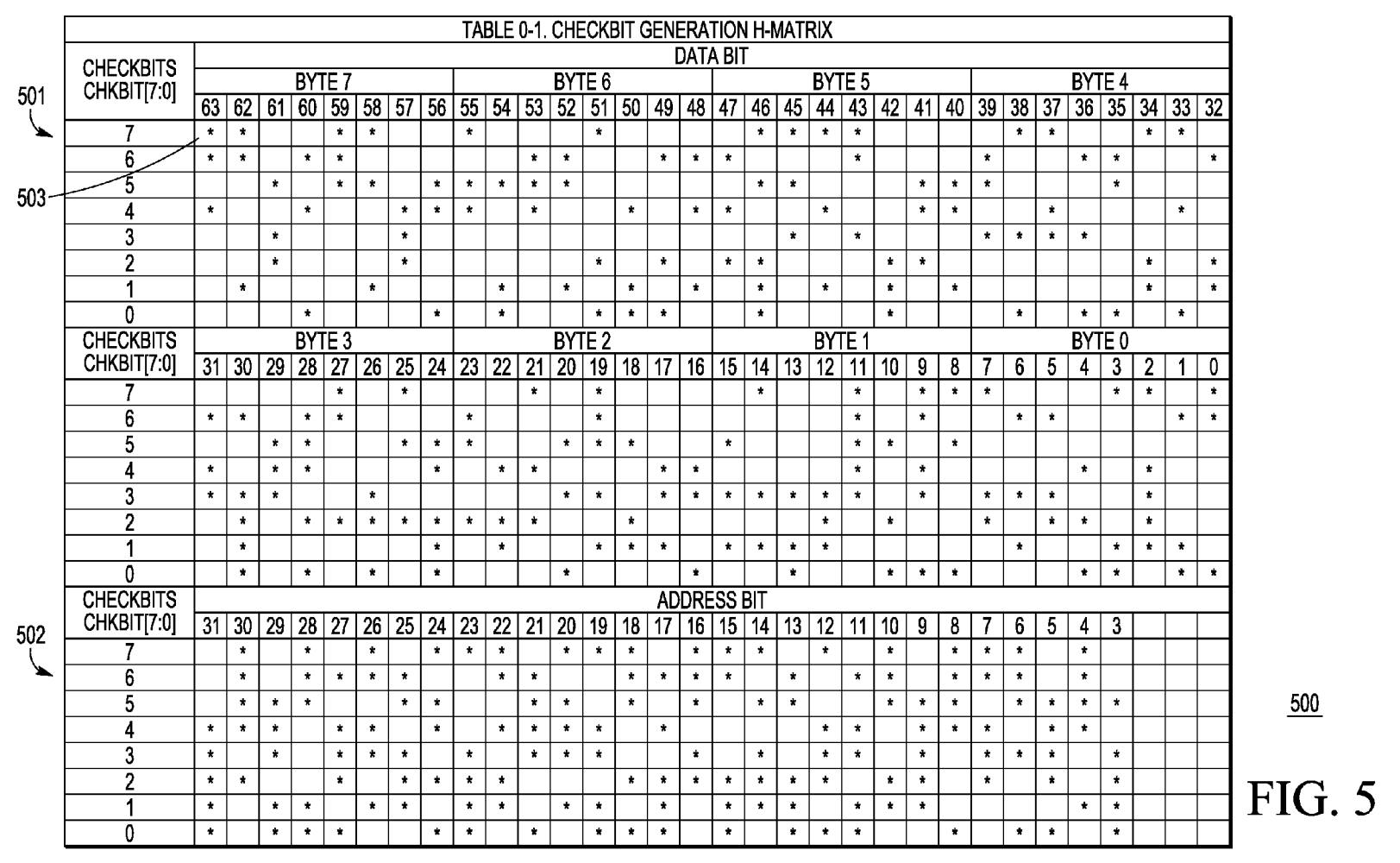

FIG. 5 illustrates a checkbit matrix 500 that can be employed to create the address XOR module 231 and data XOR module 235 of FIG. 2 in accordance with one embodiment of the present disclosure. The checkbit matrix 500 includes a data section 501 and an address section 502. The rows of the checkbit matrix are each associated with the correspondingly numbered checkbit, while the columns are each associated with a corresponding bit of the data or address. An asterisk in a matrix entry, such as entry 503, indicates that the corresponding bit of the data or address is employed to generate the corresponding data or address checkbit, respectively. Thus, for example, data checkbit 7 is generated based on data bits 63, 62, 59, 58, 55, 51, 46, 45, 44, 43, 38, 37, 34, 33, 27, 25, 21, 19, 14, 11, 9, 8, 7, 3, 2, and 0. In an embodiment, the data XOR module 235 includes a tree of XOR gates that perform a series of exclusive-OR operations to generate a data checkbit based on the data bits as indicated by the section 501 of the checkbit matrix 500. Similarly, the address XOR module 231 includes a tree of XOR gates that perform a series of exclusive-OR operations to generate an address checkbit based on the address bits as indicated by section 502 of the checkbit matrix 500.

Other embodiments, uses, and advantages of the disclosure will be apparent to those skilled in the art from consideration of the specification and practice of the disclosure disclosed herein. The specification and drawings should be considered exemplary only, and the scope of the disclosure is accordingly intended to be limited only by the following claims and equivalents thereof.

Note that not all of the activities or elements described above in the general description are required, that a portion of a specific activity or device may not be required, and that one or more further activities may be performed, or elements included, in addition to those described. Still further, the order in which activities are listed is not necessarily the order in which they are performed.

As used herein, the term "first" can refer to any selected item, and does not necessarily refer to first in time or first in a particular order. Thus, for example, the term "first checkbit" can refer to any one of a set of checkbits, and does not refer to the placement of a checkbit in time or order.

Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

What is claimed is:

1. In a data processing device comprising a processor unit coupled to a memory, a method comprising:
    receiving a memory access request comprising a memory address;
    determining error correction code (ECC) checkbits based on the memory access request;
    selectively inverting a first checkbit of the ECC checkbits based on the memory address.

2. The method of claim 1, wherein selectively inverting the first checkbit comprises:
    inverting the first checkbit in response to determining the memory address matches one of a set of predetermined address values.

3. The method of claim 1, wherein determining the ECC checkbits comprises determining the ECC checkbits based on the memory address.

4. The method of claim 1, wherein the memory access request is associated with a data value, and further comprising determining the ECC checkbits based on the memory address and the data value.

5. The method of claim 1, wherein the memory access request is a read operation.

6. The method of claim 1, wherein the memory access request is a write operation.

7. The method of claim 1, wherein selectively inverting the first checkbit based on the memory address comprises:
    inverting the first checkbit in response to determining the ECC checkbits match one of a set of predetermined checkbit patterns, the ECC checkbits based on the memory address.

8. A data processing device comprising:
    an execution unit to provide a memory address based on a received memory access operation; and
    an ECC module coupled to the execution unit, the ECC module to determine error correction code (ECC) checkbits based on the memory address wherein the ECC module selectively inverts a first checkbit of the ECC checkbits based on the memory address.

9. The data processing device of claim 8, wherein the ECC module is to selectively invert the first checkbit in response to determining the ECC checkbits match a predetermined data pattern.

10. The data processing device of claim 9, wherein the predetermined data pattern consists of a plurality of asserted data bits.

11. The data processing device of claim 9, wherein the predetermined data pattern consists of a plurality of negated data bits.

12. The data processing device of claim 8, wherein the memory access request is associated with a data value, and wherein the ECC module is to calculate the ECC checkbits based on the memory address and the data value.

13. The data processing device of claim 8, wherein a bit position of the first checkbit in the ECC checkbits is a fixed bit position.

14. The data processing device of claim 8, wherein a bit position of the first checkbit in the ECC checkbits is determined based on the memory address.

15. A device, comprising:
    a first error correction module to receive a memory address and to determine first error correction code (ECC) checkbits based on the memory address; and
    a pattern detection module coupled to the error correction module and configured to selectively invert a first checkbit of the first ECC checkbits based on the memory address.

16. The device of claim 15, wherein the pattern detection module selectively inverts the first checkbit based on the first ECC checkbits.

17. The device of claim 15 further comprising:
    a second error correction module to receive data associated with the memory address and to determine second ECC checkbits based on the data.

18. The data processing device of claim 17, wherein the pattern detection module comprises an output to provide a data pattern based on the memory address, and further comprising:
    a first exclusive-or module coupled to the pattern detection module and the first error correction module, the first exclusive-or module to determine third ECC checkbits by combining the data pattern and the first ECC checkbits based on a first exclusive-or operation.

19. The data processing device of claim 18, further comprising a second exclusive-or module coupled to the first exclusive-or module and the second error correction module, the second exclusive-or module to combine the second ECC checkbits and the third ECC checkbits to determine fourth ECC checkbits.

20. The data processing device of claim 19, further comprising a storage array coupled to the second exclusive-or module, the storage array to store the fourth ECC checkbits and the data at a memory location corresponding to the memory address.

* * * * *